(12) United States Patent
Tsubota et al.

(10) Patent No.: US 8,411,452 B2
(45) Date of Patent: Apr. 2, 2013

(54) ELECTRONIC APPARATUS

(75) Inventors: Noriyuki Tsubota, Osaka (JP); Daizo Kobayashi, Hirakata (JP)

(73) Assignee: SANYO Electric Co., Ltd., Moriguchi-shi, Osaka (JP)

( * ) Notice: Subject to any disclaimer, the term of this patent is extended or adjusted under 35 U.S.C. 154(b) by 179 days.

(21) Appl. No.: 12/820,552

(22) Filed: Jun. 22, 2010

(65) Prior Publication Data

US 2010/0328909 A1 Dec. 30, 2010

(30) Foreign Application Priority Data

Jun. 30, 2009 (JP) ................................. 2009-154479

(51) Int. Cl.
*H05K 5/00* (2006.01)
(52) U.S. Cl. .......................... 361/753; 361/807; 361/809
(58) Field of Classification Search .................. 361/753, 361/799, 807, 809, 810
See application file for complete search history.

(56) References Cited

U.S. PATENT DOCUMENTS

| | | | | |
|---|---|---|---|---|
| 6,344,972 B2 * | 2/2002 | Estieule et al. | ............... | 361/753 |
| 7,094,076 B2 * | 8/2006 | Hatakeyama | ................... | 439/97 |
| 7,310,236 B2 * | 12/2007 | Takahashi et al. | ............ | 361/757 |
| 7,401,343 B2 * | 7/2008 | Muramatsu | .................... | 720/650 |
| 7,529,104 B2 * | 5/2009 | Ito | ................................. | 361/800 |
| 7,800,911 B2 * | 9/2010 | Rieger | ........................ | 361/729 |
| 7,826,230 B2 * | 11/2010 | Lee et al. | ....................... | 361/759 |
| 7,854,520 B2 * | 12/2010 | Tsuboi | .......................... | 353/119 |
| 7,965,517 B2 * | 6/2011 | Mayumi et al. | ............... | 361/753 |
| 2006/0184956 A1 | 8/2006 | Muramatsu | | |

FOREIGN PATENT DOCUMENTS

| | | |
|---|---|---|
| JP | 2006-196102 A | 7/2006 |
| JP | 2007-294306 A | 11/2007 |

* cited by examiner

*Primary Examiner* — Hung S Bui
(74) *Attorney, Agent, or Firm* — Westerman, Hattori, Daniels & Adrian, LLP

(57) ABSTRACT

An electronic apparatus comprises a body chassis to which a cabinet is fastened by a screw, the screw is screwed from outside of the cabinet into a boss made of synthetic resin on the body chassis to pass through the boss, the body chassis is provided with a component having a metal surface arranged thereon, and the screw includes a tip opposed to the metal surface of the component. The body chassis is provided with a grounded metal plate arranged thereon, on which a projection intervening between the tip of the screw and the metal surface of the component is formed, the projection includes a through-hole through which the tip of the screw can pass, and the smallest gap length between inner peripheral surface of the through-hole and the screw is set to be smaller than the smallest gap length between the metal surface of the component and the screw.

3 Claims, 5 Drawing Sheets

ELECTRONIC APPARATUS

The application No. 2009-154479, upon which this patent application is based, is hereby incorporated by reference.

BACKGROUND OF THE INVENTION

1. Field of the Invention

The present invention relates to an electronic apparatus such as a camera or the like, and particularly to an electronic apparatus in which damage of electronic components due to electrostatic discharge is effectively inhibited.

2. Description of Related Art

Conventionally, in electronic apparatuses such as a camera or the like, various measures have been taken in order to prevent malfunction or damage of electronic components due to static electricity. For example, in an electronic apparatus in which an exterior cabinet is fastened to a body chassis by a screw, a tip of the screw might extend to a position adjacent to a metal part of the body chassis. In such a case, spark may be generated between the tip of the screw and the metal part when, for example, a screw is charged with electricity at the time of an electrostatic test. And depending on the place where spark is generated, an electronic component on a circuit board might be damaged by the spark.

Therefore, in order to prevent generation of spark as described above, a boss made of synthetic resin which the screw engages threadedly is formed in a bottomed tubular shape to obtain isolation between the tip of the screw and the metal part by a resin wall. Alternatively, employed is an earth structure in which the tip of the screw which passed through the boss is engaged threadedly with another metal component connected to a ground potential part of the circuit board to let charge accumulated due to the electrification of the screw flow into the ground potential part of the circuit board.

However, in a structure in which a boss made of synthetic resin which the screw engages threadedly is formed in a bottomed tubular shape to obtain isolation between the tip of the screw and the metal part by a resin wall, an axial dimension (height) of the boss increases, impeding downsizing of electronic apparatuses.

Also, in a structure in which the tip of the screw which passed through the boss is engaged threadedly with a metal component connected to a ground potential part of the circuit board, the metal component needs to be tapped and the number of man-hour increases.

SUMMARY OF THE INVENTION

In an electronic apparatus according to the present invention, a cabinet is fastened to a body chassis by a screw, and the screw is screwed into a boss made of synthetic resin on the body chassis from outside of the cabinet to pass through the boss. The body chassis is provided with a component having a metal surface arranged thereon, and the screw includes a tip opposed to the metal surface of the component. The body chassis is provided with a grounded metal plate arranged thereon, a projection intervening between the tip of the screw and the metal surface of the component is formed on the metal plate, the projection is provided with a through-hole through which the tip of the screw can pass, and the smallest gap length between inner peripheral surface of the through-hole and the screw is set to be smaller than the smallest gap length between the metal surface of the component and the screw.

DETAILED DESCRIPTION OF THE PREFERRED EMBODIMENT

Figure 1:
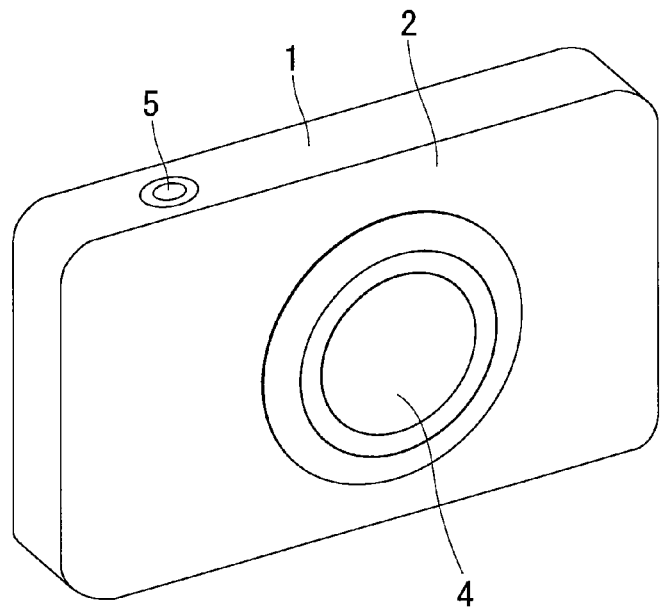
FIG. 1 is a perspective view showing front side exterior appearance of a camera which is one embodiment of the present invention.
Figure 2:
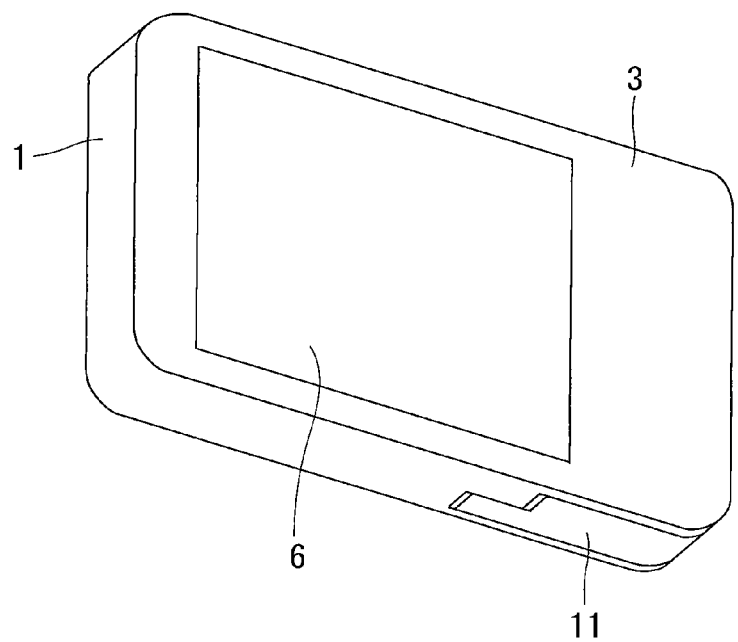
FIG. 2 is a perspective view showing rear side exterior appearance of the camera.

In a preferred embodiment discussed in detail below with reference to drawings, the present invention is implemented in a camera. As shown in FIGS. 1 and 2, a camera which is one embodiment of the present invention comprises a body chassis 1 made of synthetic resin, a front cabinet 2 made of metal arranged on a front side of the body chassis 1, and a rear cabinet 3 made of synthetic resin arranged on a rear side of the body chassis 1. The front cabinet 2 and the rear cabinet 3 are each fastened to the body chassis 1 by a plurality of screws. The body chassis 1, the front cabinet 2, and the rear cabinet 3 are provided with a shutter button 5, a photographing aperture 4, and a display 6, respectively. Also, as shown in FIG. 2, the body chassis 1 is provided with an opening/closing lid 11 on its bottom surface, and the opening/closing lid 11 is to be opened and closed for insertion and removal of an IC card and a battery.

Figure 3:
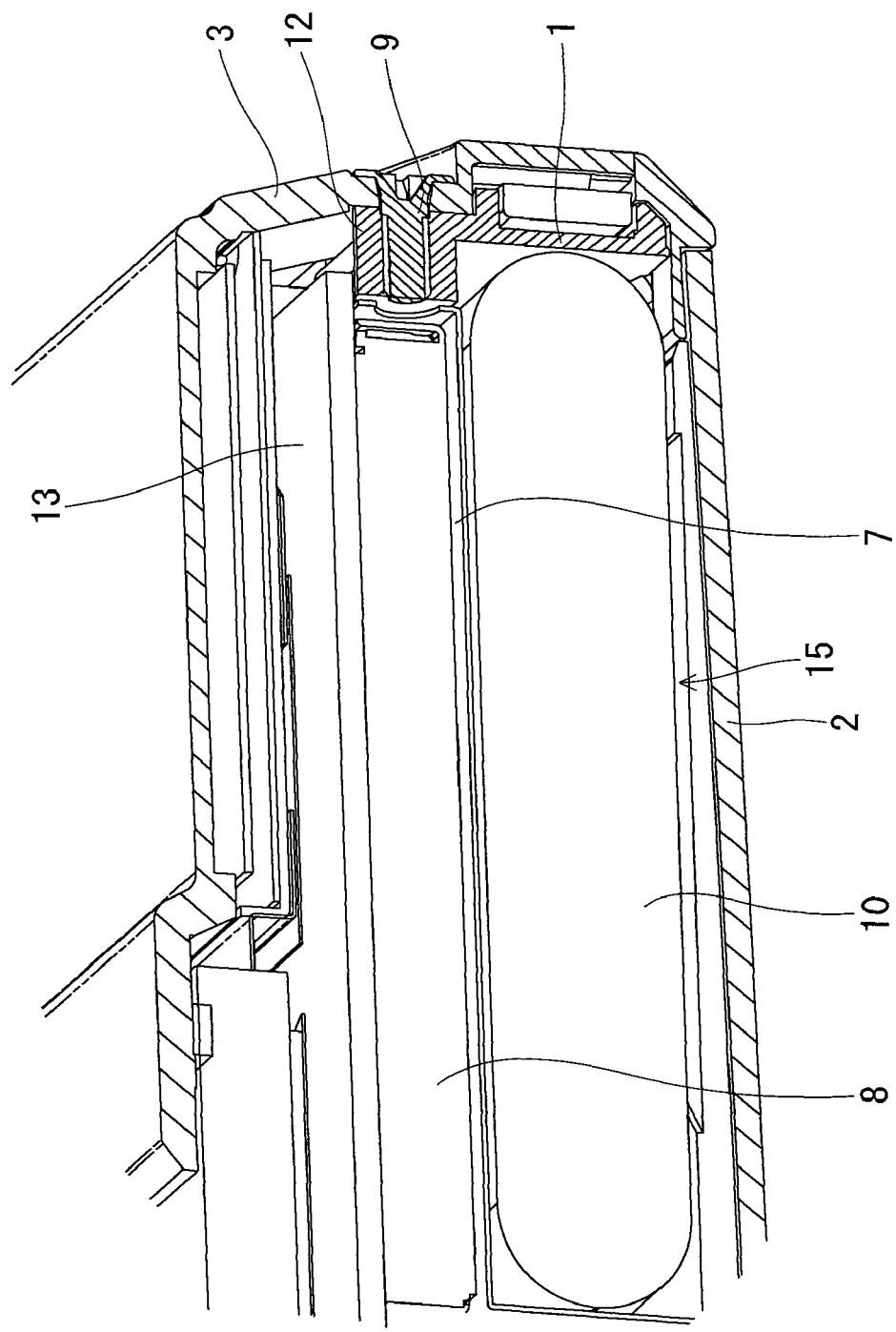
FIG. 3 is an enlarged sectional view showing an essential part of the camera.

As shown in FIG. 3, the body chassis 1 is mounted with a circuit board 13. The front cabinet 2 and the rear cabinet 3 define a battery accommodation room 15 therebetween which accommodates a battery 10. Also, an IC card socket 8 is arranged along the battery accommodation room 15, and the IC card socket 8 and the battery 10 are separated by a metal partition plate 7.

Figure 4:
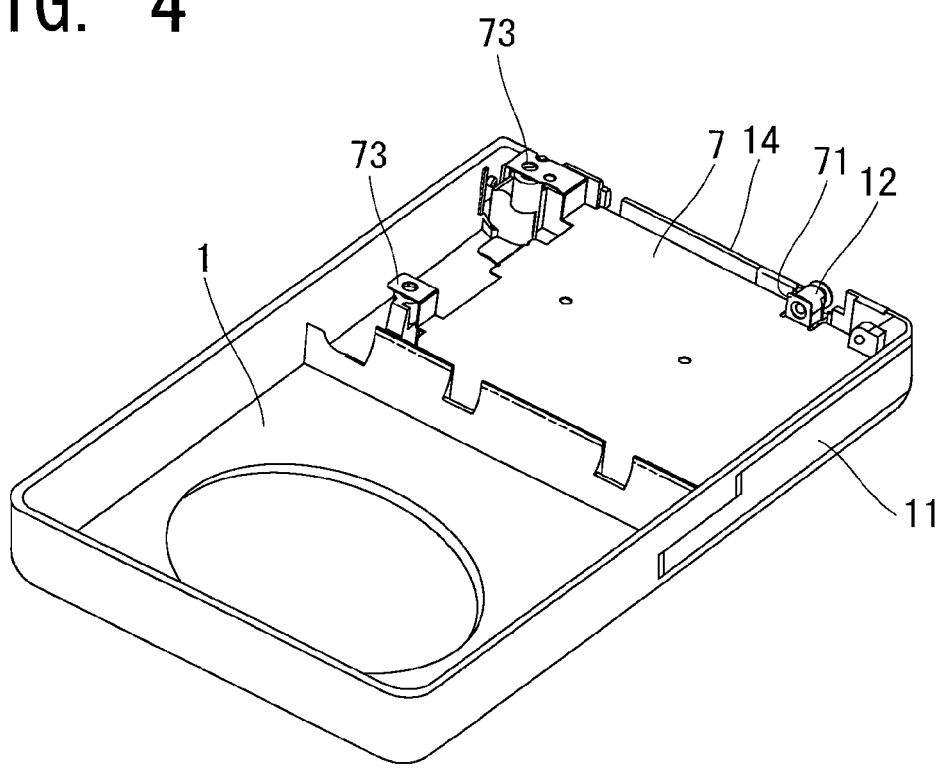
FIG. 4 is a perspective view showing a partition plate on the body chassis in the camera.
Figure 5:
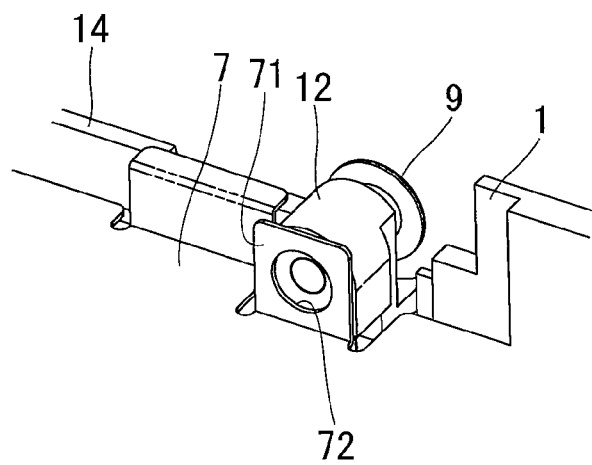
FIG. 5 is an enlarged perspective view showing a boss of the body chassis and a projection of the partition plate in the camera.

As shown in FIGS. 4 and 5, the body chassis 1 includes a side wall 14, on which a boss 12 is formed. The rear cabinet 3 is fastened to the body chassis 1 by screwing a screw 9 from outside of the rear cabinet 3 into the boss 12 of the body chassis 1 as shown in FIG. 3.

The boss 12 of the body chassis 1 is formed in a shape of cylinder without a bottom as shown in FIG. 3, and a tip of the screw 9 passes through the boss 12. Also, as shown in FIGS. 4 and 5, the partition plate 7 includes a projection 71 opposed to an end face of the boss 12 of the body chassis 1, and the projection 71 is provided with a through-hole 72 through which the tip of the screw 9 can pass. The through-hole 72 is a circular aperture concentric with a medial axis of the screw 9, and has an inner diameter greater than an outer diameter of the screw 9. And an inner peripheral surface of the through-hole 72 is not tapped.

Figure 6:
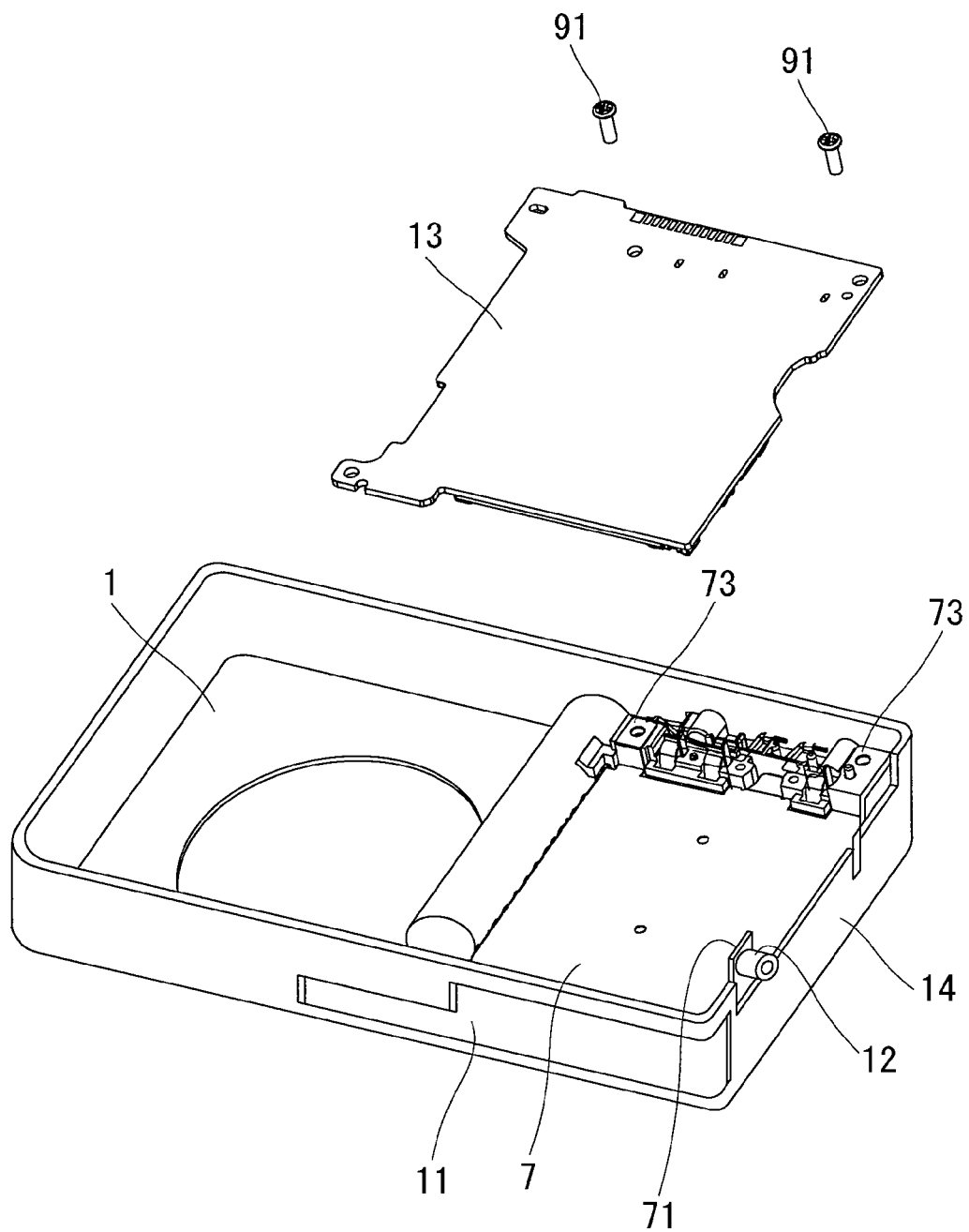
FIG. 6 is a perspective view showing a circuit board on the body chassis in the camera.

As shown in FIG. 6, a plurality of tongues 73, 73 having a predetermined height are formed on an end part of the partition plate 7, and a circuit board 13 is placed on the tongues 73, 73. The circuit board 13 is fastened to the tongues 73, 73 by a plurality of screws 91, 91. A ground potential part is formed on a rear surface of the circuit board 13 in a position being in contact with the tongues 73, of the partition plate 7, and the partition plate 7 is thereby grounded.

Figure 7:
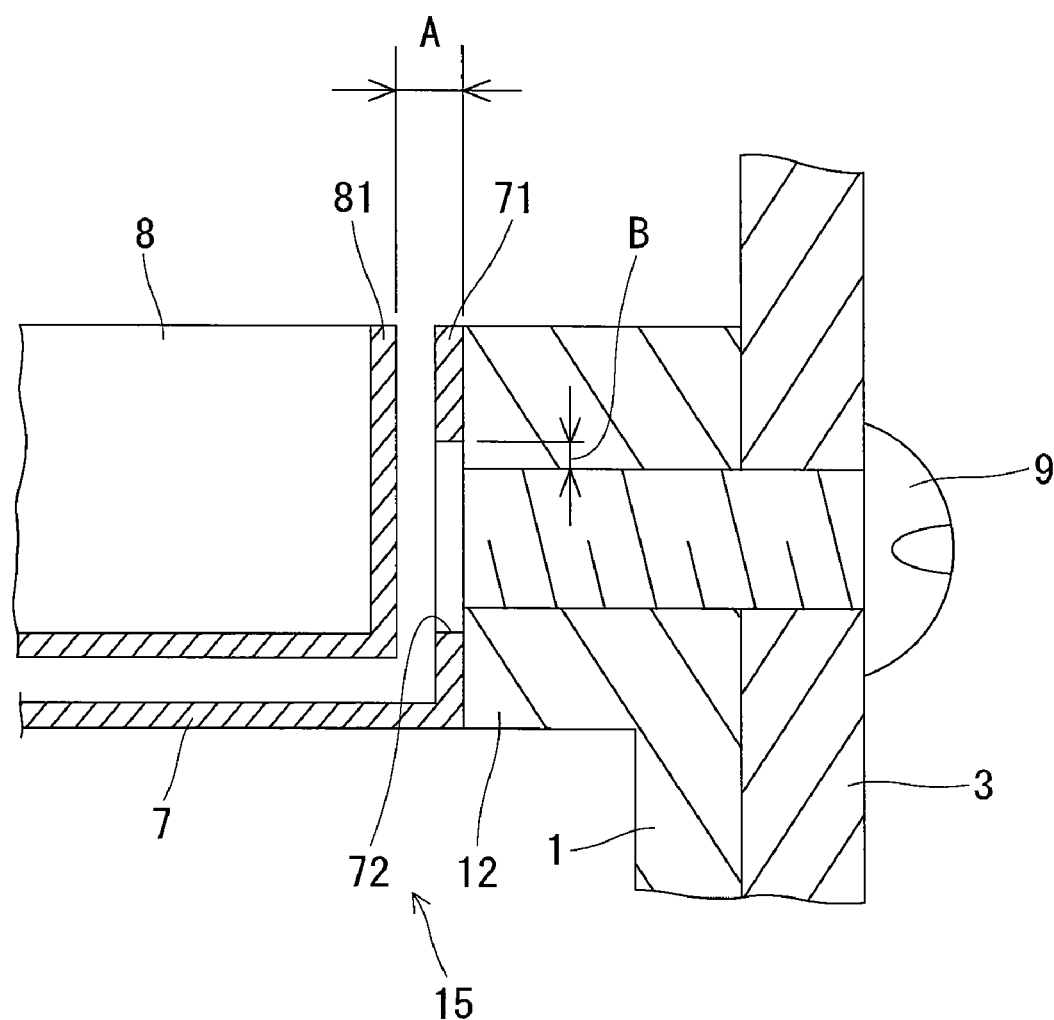
FIG. 7 is an enlarged sectional view showing a positional relation of a screw, the projection and an IC card socket in the camera.

As shown in FIG. 7, the projection 71 of the partition plate 7 intervenes between the boss 12 of the body chassis 1 and a metal housing 81 of the IC card socket 8, and is in contact with the end face of the boss 12. The screw 9 has such a length that the tip thereof is flush with the end face of the boss 12 when the screw 9 is screwed into the boss 12. If the length of the screw 9 is slightly greater than a predetermined value by dimensional tolerance, the tip of the screw 9 is accommodated in the through-hole 72 of the projection 71.

The smallest gap length A between the housing 81 of the IC card socket 8 and the tip of the screw 9 is set to approximately 0.3 mm, and the smallest gap length B between inner peripheral surface of the through-hole 72 of the projection 71 and the tip of the screw 9 is set to approximately 0.1 mm.

In the above described camera, even if the screw 9 is charged with electricity due to electrostatic tests or the like, because the smallest gap length B between the inner peripheral surface of the through-hole 72 of the projection 71 and the tip of the screw 9 is set to be smaller than the smallest gap length A between a surface of the housing 81 of the IC card socket 8 and the tip of the screw 9, discharge occurs between at a point where the gap length is smaller, namely between the projection 71 and the screw 9, to prevent discharge between the surface of the housing 81 of the IC card socket 8 and the tip of the screw 9.

Because the partition plate 7 is connected to the ground potential part of the circuit board 13 as described above, charge flows from the partition plate 7 to the ground potential part of the circuit board 13, and therefore an electronic component on the circuit board 13 is not damaged by generation of spark.

In the above described camera, employed is a fastening structure in which the boss 12 of the body chassis 1 is formed in a tubular shape without a bottom and the screw 9 passes through the boss 12, and therefore, the height of the boss 12 is smaller than that of a conventional boss of bottomed tubular shape, thereby realizing downsizing of the camera. Also, employed is a structure in which the projection 71 of the partition plate 7 is provided with the through-hole 72 and the tip of the screw 9 which passed through the boss 12 can be accommodated in the through-hole 72. Therefore, it is not necessary to tap the inner peripheral surface of the through-hole 72, thereby decreasing the number of man-hour and therefore reducing manufacturing cost.

The present invention is not limited to the foregoing embodiment in construction but can be modified variously by one skilled in the art without departing from the spirit of the invention as set forth in the appended claims. For example, as a structure for grounding the partition plate 7, a ground potential part of another component can be utilized as well as the configuration of connecting the partition plate 7 to the ground potential part of the circuit board 13.

What is claimed is:

1. An electronic apparatus comprising a body chassis to which an exterior cabinet is fastened by a screw, the screw being screwed from outside of the cabinet into a boss made of synthetic resin on the body chassis to pass through the boss, the body chassis being provided with a component having a metal surface arranged thereon, and the screw including a tip opposed to the metal surface of the component, wherein the body chassis is provided with a grounded metal plate arranged thereon, a projection intervening between the tip of the screw and the metal surface of the component is formed on the grounded metal plate, the projection is provided with a through-hole through which the tip of the screw can pass, and a smallest gap length between inner peripheral surface of the through-hole and the tip of the screw is set to be smaller than a smallest gap length between the metal surface of the component and the tip of the screw.

2. The electronic apparatus according to claim 1, wherein the body chassis is provided with a circuit board including a ground potential part, the component having the metal surface is arranged in a position adjacent to the circuit board, and the metal plate is connected to the ground potential part of the circuit board.

3. An electronic apparatus according to claim 1, wherein the component having the metal surface is an IC card socket, and the metal plate is a partition plate separating the IC card socket and a battery.

\* \* \* \* \*